(12) United States Patent
Sira

(10) Patent No.: US 10,284,166 B2
(45) Date of Patent: May 7, 2019

(54) TRANSMITTER MATCHING NETWORK USING A TRANSFORMER

(71) Applicant: Intel Corporation, Santa Clara, CA (US)

(72) Inventor: Daniel Sira, Munich (DE)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/634,111

(22) Filed: Jun. 27, 2017

(65) Prior Publication Data

US 2018/0375488 A1    Dec. 27, 2018

(51) Int. Cl.
*H03H 7/38* (2006.01)
*H04B 1/40* (2015.01)
*H04L 25/02* (2006.01)

(52) U.S. Cl.
CPC ............... *H03H 7/38* (2013.01); *H04B 1/40* (2013.01); *H04L 25/0278* (2013.01)

(58) Field of Classification Search
CPC ......... H03H 7/38; H04L 25/0278; H04B 1/40
USPC ....................................................... 455/77
See application file for complete search history.

(56) References Cited

U.S. PATENT DOCUMENTS

| | | | |
|---|---|---|---|
| 5,986,617 A | 11/1999 | McLellan | |
| 6,801,114 B2 | 10/2004 | Yang et al. | |
| 7,129,784 B2 | 10/2006 | Bhatti et al. | |
| 8,884,562 B1 * | 11/2014 | Cameron, Jr. | ............ H02P 6/10 318/400.29 |
| 2009/0200290 A1 | 8/2009 | Cardinal et al. | |
| 2010/0136942 A1 | 6/2010 | Lee et al. | |
| 2012/0013387 A1 | 1/2012 | Sankaranarayanan et al. | |
| 2012/0075016 A1 | 3/2012 | Visser et al. | |
| 2013/0057343 A1 | 3/2013 | Kondo | |
| 2014/0111275 A1 | 4/2014 | Khlat et al. | |
| 2016/0336915 A1 | 11/2016 | Kavousian et al. | |
| 2017/0077877 A1 | 3/2017 | Anderson | |

OTHER PUBLICATIONS

European Search Report dated Nov. 16, 2018 in connection with European Patent Application EP 18174452.5.

* cited by examiner

*Primary Examiner* — Eugene Yun
(74) *Attorney, Agent, or Firm* — Eschweiler & Potashnik, LLC

(57) ABSTRACT

An apparatus for a network matching switch is provided. The apparatus includes a primary winding, a first secondary winding, a second secondary winding and a plurality of matching network paths. The primary winding is configured to generate a magnetic field based on an analog input signal. The first secondary winding is configured is inductively coupled to the primary winding. The second secondary winding is inductively coupled to the primary winding. The plurality of matching network paths are coupled to the first secondary winding and the second secondary winding. An active path is selected from the plurality of matching network paths and provides power to an active load.

16 Claims, 10 Drawing Sheets

TRANSMITTER MATCHING NETWORK USING A TRANSFORMER

FIELD

The present disclosure relates radio frequency (RF) applications and, more particularly, to matching networks for RF applications.

BACKGROUND

Radio frequency (RF) transmission systems typically use impedance matching or matching networks to more efficiently transmit signals. The impedance matching facilitates power transfer from a source to a load.

Impedance matching for RF applications facilitates the power efficiency and power transfer from an RF source to an RF load. Typically, the source is an RF signal source or generator and the load is an RF antenna or antenna array.

RF applications include those where multiple loads are used. The RF loads typically have varied impedances. Thus, there can be a mismatch between the source RF impedance and one or more of the RF load impedances.

What is needed is an efficient technique to facilitate impedance matching for RF applications where a single RF source is used for a plurality of RF loads.

BRIEF DESCRIPTION OF THE DRAWINGS

Some examples of circuits, apparatuses and/or methods will be described in the following by way of example only. In this context, reference will be made to the accompanying Figures.

DETAILED DESCRIPTION

Figure 1:
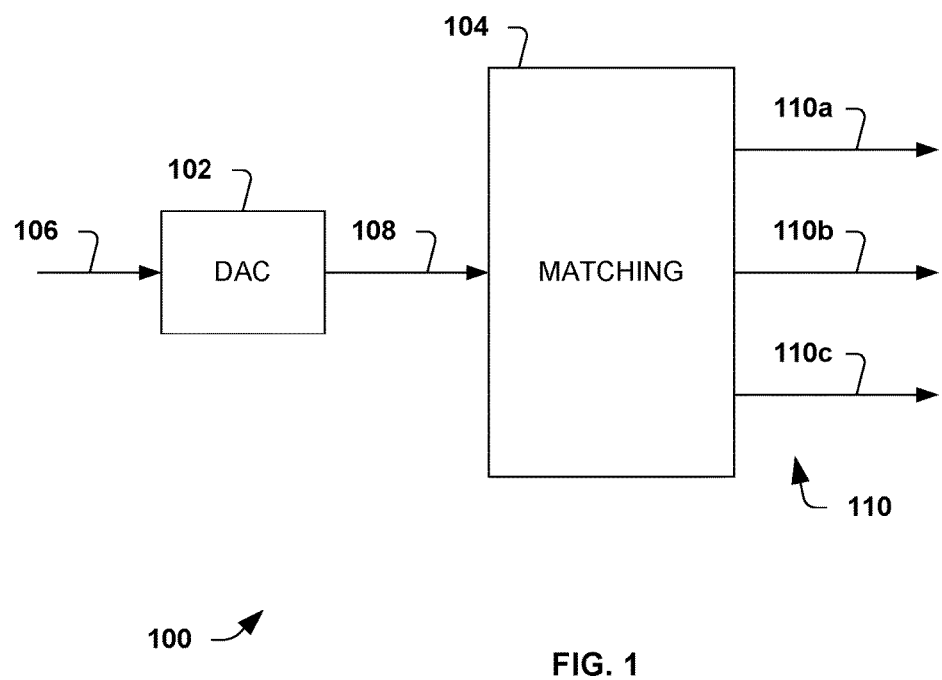
FIG. 1 is a diagram illustrating a transmitter matching network arrangement.

The present disclosure will now be described with reference to the attached drawing figures, wherein like reference numerals are used to refer to like elements throughout, and wherein the illustrated structures and devices are not necessarily drawn to scale.

As utilized herein, terms "component," "system," "interface," "circuit" and the like are intended to refer to a computer-related entity, hardware, software (e.g., in execution), and/or firmware. For example, a component can be a processing circuit (e.g., a microprocessing circuit, a controller, or other processing device), a process running on a processing circuit, a controller, an object, an executable, a program, a storage device, a computer, a tablet PC and/or a user equipment (e.g., mobile phone, etc.) with a processing device. By way of illustration, an application running on a server and the server can also be a component. One or more components can reside within a process, and a component can be localized on one computer and/or distributed between two or more computers. A set of elements or a set of other components can be described herein, in which the term "set" can be interpreted as "one or more."

Further, these components can execute from various computer readable storage media having various data structures stored thereon such as with a module, for example. The components can communicate via local and/or remote processes such as in accordance with a signal having one or more data packets (e.g., data from one component interacting with another component in a local system, distributed system, and/or across a network, such as, the Internet, a local area network, a wide area network, or similar network with other systems via the signal).

As another example, a component can be an apparatus with specific functionality provided by mechanical parts operated by electric or electronic circuitry, in which the electric or electronic circuitry can be operated by a software application or a firmware application executed by one or more processing circuits. The one or more processing circuits can be internal or external to the apparatus and can execute at least a part of the software or firmware application. In yet another example, a component can be an apparatus that provides specific functionality through electronic components without mechanical parts; the electronic components can include one or more processing circuits therein to execute software and/or firmware that confer(s), at least in part, the functionality of the electronic components.

Use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. Furthermore, to the extent that the terms "including", "includes", "having", "has", "with", or variants thereof are used in either the detailed description and the claims, such terms are intended to be inclusive in a manner similar to the term "comprising."

In the following description, a plurality of details is set forth to provide a more thorough explanation of the embodiments of the present disclosure. However, it will be apparent to one skilled in the art that embodiments of the present disclosure may be practiced without these specific details. In other instances, well-known structures and devices are shown in block diagram form rather than in detail in order to avoid obscuring embodiments of the present disclosure.

In addition, features of the different embodiments described hereinafter may be combined with each other, unless specifically noted otherwise.

Impedance matching for radio frequency (RF) applications facilitates power efficiency and power transfer from an RF source to an RF load. Typically, the source is an RF signal source or generator and the load is an RF antenna or antenna array. Conjugate matching is where a load impedance is a complex conjugate of a source impedance. When the load impedance is a complex conjugate of the source impedance, it is referred to as a conjugate match. Power matching is where a source and/or load impedances are adjusted to improve power transfer from a source to a load. The match can be referred to as a power match. An impedance matching network or circuit can be utilized to modify or match the RF impedance at the source with the impedance at the load to facilitate conjugate matching and/or power matching.

However, some RF applications utilize multiple RF loads for a single or given RF source. The multiple RF loads can include varied frequencies, impedances, and the like. Thus, each RF load has matching characteristics.

The RF impedance matching can be performed by the impedance matching network or circuit. However, the matching network has to perform different or varied impedance matching for the various RF loads.

One approach to perform the impedance matching is to utilize a transformer having a primary winding and a secondary winding. First and second matching circuit paths are coupled to the secondary winding to provide varied impedance matching for the various RF loads. In operation, one of the circuit paths is switched off while the other circuit path is used for impedance matching. This approach is only able to provide two impedance matching outputs. Further, switches and switch controls are required to obtain a selected impedance matching. The required switches and switch controls lead to increased insertion loss and larger die area consumption. Further, the required switches and switch controls can also degrade or reduce linearity, isolation, power handling and the like. Additionally, a relatively large output signal is typically seen by all switches, which can make isolation and power handling, particularly when switches are in an OFF state, difficult to achieve.

A technique is provided that utilizes a transformer having multiple secondary coils to provide multiple impedance matching outputs. The transformer includes a primary coil and multiple secondary coils. The multiple secondary coils can be used to provide multiple impedance matchings or multiple impedance output signals without requiring switches and separate impedance matching paths for each impedance output signal. The transformer is part of a transformer based matching network circuit.

FIG. 1 is a diagram illustrating a transmitter matching network arrangement 100. The arrangement 100 utilizes a transformer to match and select impedances for network or impedance matching for transmission signal. The arrangement is shown in a simplified form to facilitate understanding. It is appreciated that additional circuits and/or components can be utilized with the arrangement 100.

The transmitter (TX) arrangement 100 includes a digital to analog converter (DAC) 102 and a matching component or circuit 104. The arrangement 100 is configured to generate a matched output signal 110 based on selected matching characteristics and an input signal 106. The selected matching characteristics include standard specifications, power value, frequency, range of frequencies, impedance matching value, network matching, and the like.

The matched output signal 110 is typically one of a plurality of output signals shown in FIG. 1 as 110a, 110b, and 110c. The plurality of output signals generally have different matching characteristics for various modes of operation. In one example, the plurality of output signals are amplitude and phase modulated voltage signals. The plurality of output signals can have matching characteristics of such as average output power and carrier frequency, depending on the mode of operation (e.g., GSM, 2G, 3G, LTE, band number, and the like). In another example, the plurality of output signals and/or mode include one or more of a 2 GHz output frequency, global system for mobile communication (GSM) 1800, GSM 1900, and the like. In yet another example, the plurality of output signals and/or mode include one or more of UMTS bands 1-3.

The output signals 110 have associated output paths, that can be active/ON and supplying power to a load or inactive/OFF. An inactive path is typically at a low impedance or high impedance, such as ground or open circuit, as described below.

The DAC 102 is configured to convert a digital input signal 106 into an analog input signal 108. The digital input signal 106 is received at an input and the analog input signal 108 is provided at an output. The DAC 102 can utilize suitable techniques, such as interpolation, filtering and the like to generate the analog input signal 108.

In one example, the DAC 102 is a capacitive based DAC, referred to as a CDAC. The CDAC utilizes inverters and output capacitors, in parallel, to perform the DAC. It is appreciated that other types of DACs can be used for the DAC 102.

The matching circuit 104 is configured to generate the matched output signal 110 from the analog input signal 108. As described above, the matched output signal has a plurality of output signals have respective matching characteristics.

The matching circuit 104 generates the plurality of output signals using a transformer having a primary winding and secondary windings. The plurality of output signals are provided at a plurality of outputs of the matching circuit 104. The primary winding is a single winding and is generally coupled to the analog input signal 108. The secondary windings include a first secondary winding and a second secondary winding. The first secondary winding and the second secondary winding are inductively coupled to the primary winding. The first secondary winding can be configured to at least partially generate a first output signal of the plurality of output signals. The second secondary winding can be configured to at least partially generate a second output signal of the plurality of output signals. The second output signal can different matching characteristics than the first output signal. The secondary windings can also be configured to generate additional output signals of the plurality of output signals.

The matching circuit 104 can also include additional circuitry, such as impedance components, resistors, transistors, switches and the like in order to generate the plurality of output signals and associated matching characteristics.

In one example, the primary winding and the secondary windings are within the matching circuit 104. In another example, the primary winding is external to the matching circuit 104. In yet another example, the primary winding and the secondary windings are external to the matching circuit 104.

The DAC and/or the matching circuit 104, including paths and the additional circuitry, can be controlled, selected and/or configured by circuitry and/or logic, such as baseband circuitry, a digital signal processor (DSP) and the like.

Thus, the arrangement 100 is configured to generate a plurality of output signals having selected matching characteristics using a transformer that includes a primary winding and secondary windings. The arrangement 100 is also configured to have the matching characteristics to support multiple modes for the output signals. The multiple secondary windings facilitate generation of the output signals without requiring switches or a large number of switches, as required by other approaches. It is appreciated that switch(es) are typically implemented in complementary metal oxide semiconductor (CMOS). The switches typically increase insertion loss, reduce feasible area for other components, reduce linearity, reduce isolation and the like.

Generally, the arrangement provides one of the power via one of the signal(s) 110. Whichever signal is providing power is considered active or has an active path/load. The other signals are considered inactive. For example, output signal 110a can be active while output signal 110b and output signal 110c are inactive.

The arrangement 100 can generate the plurality of output signals using 1:3, 1:4 switching and the like. Some examples of supported modes include TX 2G, GSM 1800 and 1900 bands, TX 3G, LTE bands (e.g., 1.4-2 GHz), TX 3G, LTE band based on a region (e.g., China, Japan, . . . ) and the like.

Figure 2:
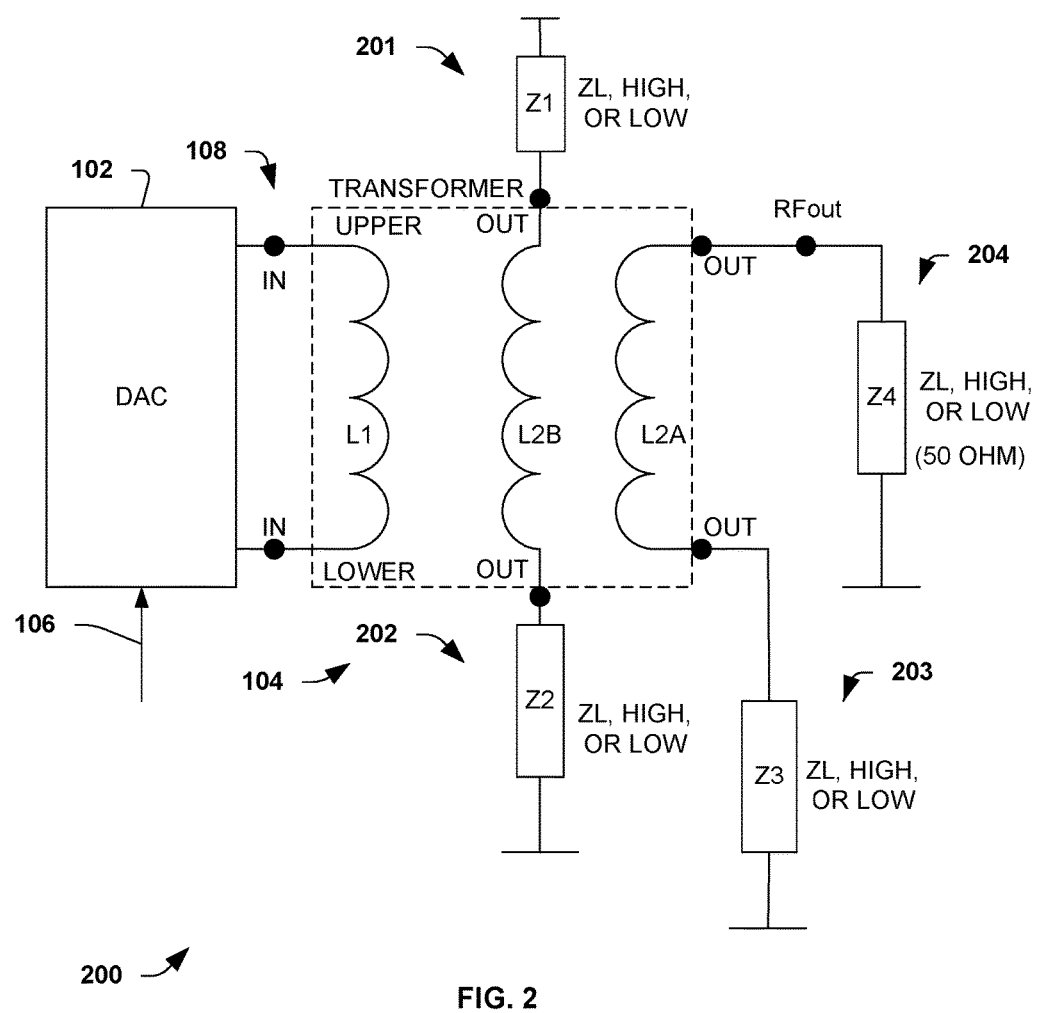
FIG. 2 is a diagram illustrating a transmitter matching network arrangement that functions as a 1:4 RF switch.

FIG. 2 is a diagram illustrating a transmitter matching network arrangement 200 that functions as a 1:4 RF switch. The arrangement 200 utilizes a transformer to match and select impedances for network or impedance matching for transmission signal. The arrangement 200 is shown in a simplified form to facilitate understanding. It is appreciated that additional circuits and/or components can be utilized with the arrangement 200. The arrangement 200 can be implemented as an apparatus, circuitry, logic and/or the like.

The transmitter (TX) arrangement 200 includes a digital to analog converter (DAC) 102 and a matching component or circuit 104. The arrangement 200 is configured to generate a plurality of output signals based on an input signal 106. The plurality of output signals have selected matching characteristics. The selected matching characteristics include standard specifications, power value, frequency, range of frequencies, impedance matching value, network matching, and the like. Generally, one of the plurality of output signals is generated for an active load/impedance and the other output signals and their associated paths/circuits are inactive.

The matching circuit 104 includes a transformer and a plurality of matching circuit paths coupled to the transformer. The transformer includes a primary winding L1, a first secondary winding L2A and a second secondary winding L2B. The primary winding L1 has two associated input pins, the first secondary winding L2A has two associated output pins and the second secondary winding L2B also has two associated output pins. The matching circuit paths include a first path 201, a second path 202, a third path 203 and a fourth path 204. The secondary windings L2A and L2B are magnetically coupled to the primary winding L1. The first path 201, the second path 202, the third path 203 and the fourth path 204 include a first impedance Z1, a second impedance Z2, a third impedance Z3 and a fourth impedance Z4. The impedances or load impedances (ZL) Z1, Z2, Z3 and Z4 represent load impedances for the associated path/circuit and subsequent circuit/block/device (e.g., a power amplifier). When the load is not active (i.e., no load is attached), the impedances Z1, Z2, Z3 and Z4 can be set/configured to be in an OFF state, which can be a high or a low impedance state. Thus, the impedances Z1 to Z4 can be selected as active load impedance (ZL) or OFF. When OFF, the impedances Z1 to Z4 are configured to have a high impedance state or a low impedance state.

An active impedance is a load impedance to which output power has to be delivered. As an example, active impedance can represent the input impedance of an active power amplifier, power amplifier driver, antenna, duplexer, switch, filter and the like. A typical value for an active impedance is 50 ohm, however it is appreciated that other values are contemplated. The arrangement 200 provides power to one of the paths (201, 202, 203, and 204) at a given time. The path and load being provided power is considered active, thus providing the 1:4 operation.

The output pins for the first secondary winding L2A include an upper output pin connected to the fourth path 204 and a lower output pin connected to the third path 203. The output pins for the second secondary winding L2B include an upper output pin connected to the first path 201 and a lower output pin connected to the second path 202.

An OFF impedance of the network or paths after the transformer can be low or high. If the off impedance is high, it is relatively high with reference to a load or actual load. In one example, the OFF impedance is at least 4 times larger than the load impedance. Thus, a load impedance of 50 ohm relates to an OFF impedance of 200 or more Ohm.

The first path 201 has the first impedance Z1 that can be set to an active ON or OFF/inactive state. The first impedance Z1 is configured to be in a high impedance state. As shown above, the high impedance state typically at least 4 times larger than a load or actual load impedance. The second path 202 has second impedance shown as Z2, which is assumed to be OFF and in a high impedance state. The third path 203 also has a third impedance Z3, which is set to OFF and as low impedance. The fourth path 204 includes an RFout node or output and a fourth path impedance Z4. The fourth path impedance Z4 is shown as 50 ohm, however it is appreciated that other values may be utilized. Thus, in the arrangement 200 shown, the impedance Z1 is set to a high impedance state (OFF), the impedance Z2 is set to a high impedance state (OFF) and the impedance Z3 is set to a low impedance state (OFF).

Generally, the secondary coils L2A and L2B have at least one attached impedance set to a high impedance if the coil is inactive. If the secondary coil is active, such as the first secondary coil L2A in this example, the attached load impedance Z3 is set to low impedance.

The arrangement 200 uses the matching paths 201, 202, 203 and 204 to generate or provide the 1:4 RF switch functionality.

The two secondary coils, L2A and L2B, permit the 1:4 switch functionality without requiring additional switches.

Figure 3A:
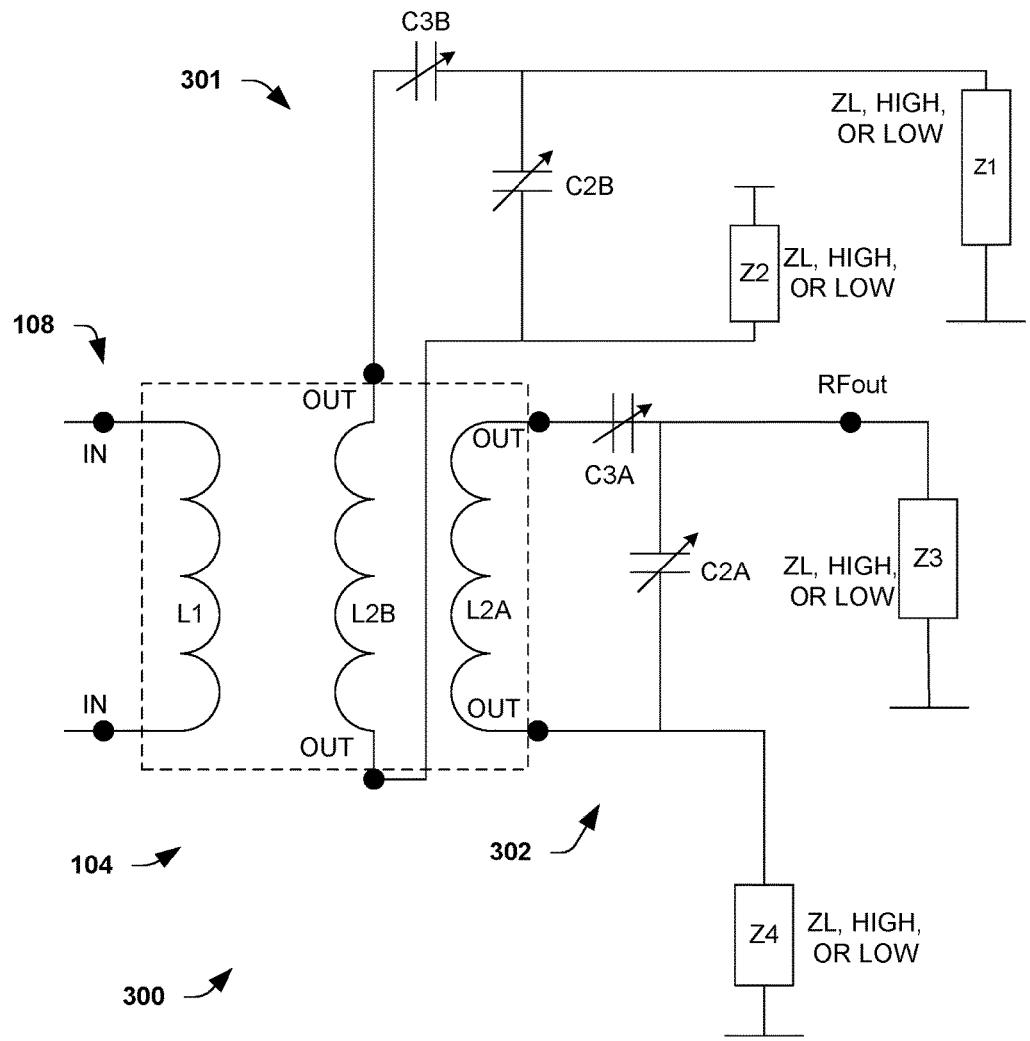
FIG. 3A is a diagram illustrating a transmitter matching network arrangement that utilizes adjustable capacitors to facilitate harmonic tuning.
Figure 3B:
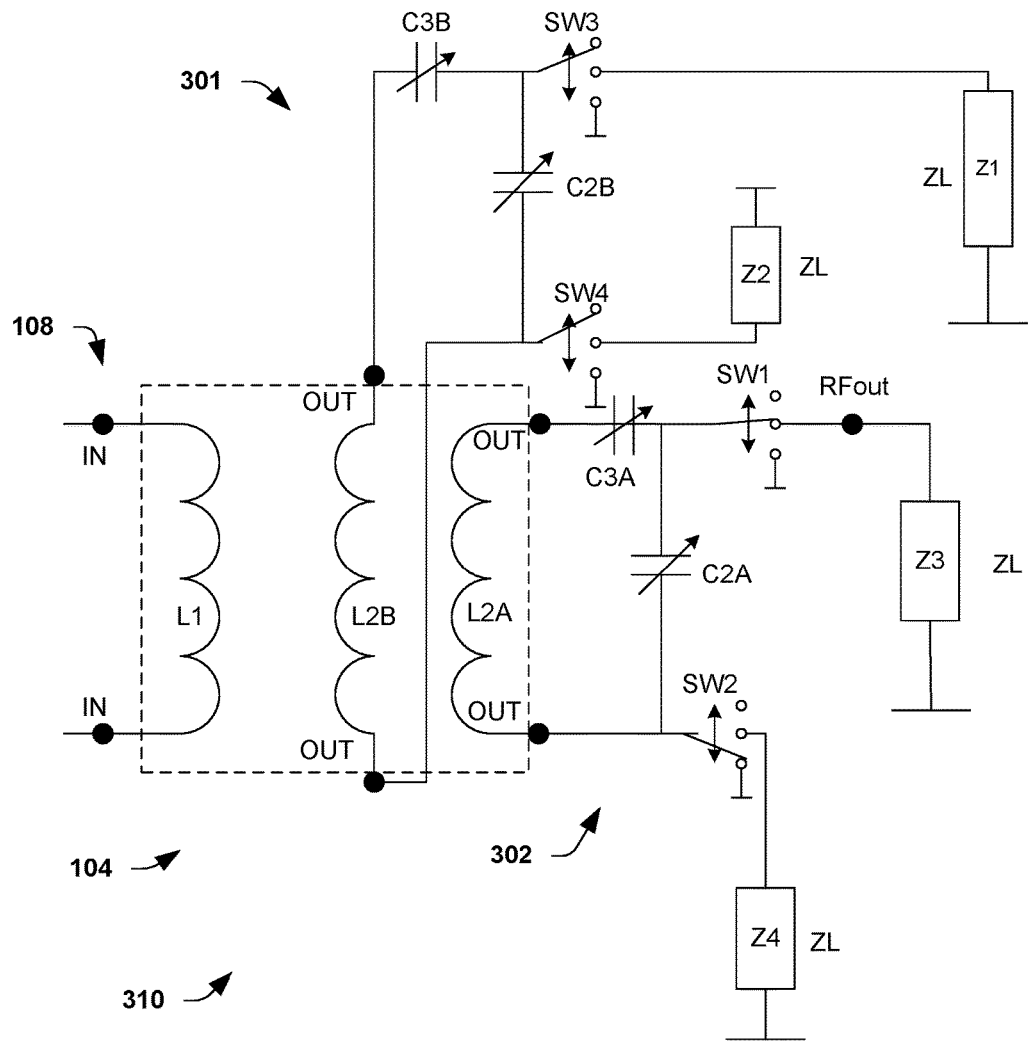
FIG. 3B is a diagram illustrating a transmitter matching network arrangement that utilizes adjustable capacitors to facilitate harmonic tuning.

FIGS. 3A and 3B illustrate transmitter matching network arrangements 300 and 310 that utilize adjustable capacitors to facilitate harmonic tuning. The arrangement 300 is shown in FIG. 3A and the arrangement 310 is shown in FIG. 3B. The arrangements 300 and 310 include a transformer having multiple secondary windings. It is appreciated that additional circuits and/or components can be utilized with the arrangements 300, 310. The arrangements 300, 310 can be implemented as an apparatus, circuitry, logic and/or the like.

The arrangements 300 and 310 are substantially similar. The arrangement 300 omits switches whereas the arrangement 310 includes switches. It is appreciated that various load terminations (e.g., ZL, HIGH, LOW) and various switch topologies (e.g., two-way, three-way, shunt switch) can be utilized. Switches SW1-SW4 can be of different type/topology according to their associated loads Z1-Z4. Each selected load type restricts the degree of freedom on the switch design/topology.

Generally, transformers or active transformers have a relatively broad frequency response. The broad frequency response can result in generation of fundamental harmonics, such as second harmonics, third harmonics and the like. The generated fundamental harmonics can be problematic for applications, such as RF and/or cellular communication. Thus, the arrangement 300 utilizes adjustable capacitors to perform harmonic tuning and mitigate or prevent generation of the fundamental harmonics.

Typical modern cellular systems utilize carrier aggregation. Thus, it can happen that one carrier is in a 900 MHz band and a second carrier is in a 1.8 GHz or 2.7 GHz band. Harmonics generated by transmission using one carrier can interfere with that of another. Thus, the arrangement 300 can attenuate or mitigate the unwanted harmonics and prevent or reduce the resulting interference.

Additionally, cellular system can utilize FDD systems with carrier aggregation, where a harmonic of a transmitter can fall into a receive band. The arrangement 300 can be utilized to attenuate or mitigate the unwanted harmonics and prevent or reduce the resulting interference.

The transmitter (TX) arrangements 300 and 310 include a matching component or circuit 104. The arrangements 300 and 310 are configured to generate a plurality of output signals based on an analog input signal 108. The plurality of output signals have selected matching characteristics. The selected matching characteristics include standard specifications, power value, frequency, range of frequencies, impedance matching value, network matching, and the like.

The matching circuit 104 includes a transformer and a plurality of matching circuit paths coupled to the transformer. The transformer includes a primary winding L1, a first secondary winding L2A and a second secondary winding L2B. The primary winding L1 has two associated input pins, the first secondary winding L2A has two associated output pins and the second secondary winding L2B also has two associated output pins. The matching circuit paths include a first path/circuit 301 and a second path/circuit 302. The secondary windings L2A and L2B are magnetically coupled to the primary winding L1. The first path 201, the second path 202, the third path 203 and the fourth path 204 include a first impedance Z1, a second impedance Z2, a third impedance Z3 and a fourth impedance Z4. The impedances or load impedances (ZL) Z1, Z2, Z3 and Z4 represent load impedances for the associated path/circuit and subsequent circuit/block/device (e.g., a power amplifier). When the load is not active (i.e., no load is attached), the impedances Z1, Z2, Z3 and Z4 can be set/configured to be in an OFF state (low impedance or high impedance state). Thus, the impedances Z1 to Z4 can be selected as active load impedance (ZL) or OFF. When OFF, the impedances Z1 to Z4 are configured to have a high impedance state or a low impedance state.

For the arrangement 300 shown in FIG. 3A, the first path 301 includes an adjustable capacitor C3B connected to an upper output pin of the second secondary winding L2B. The load Z1 is connected to the capacitor C3B and a second adjustable capacitor C2B. The capacitor C2B is also connected to a lower output pin of the second secondary winding L2B. The second load Z2 is also connected to the lower output pin of the secondary winding L2B.

For the arrangement 300, the second path 302 includes an adjustable capacitor C3A connected to an upper output pin of the first secondary winding L2A. An RFout terminal is connected to the capacitor C3A. A third load Z3 is connected to the RFout terminal. A fourth adjustable capacitor C2A is connected to the capacitor C3A and a lower output pin of the first secondary winding L2A. A fourth impedance Z4 is also connected to the lower output pin of the first secondary winding L2A.

For the arrangement 310 shown in FIG. 3B, the first path 301 includes an adjustable capacitor C3B connected to an upper output pin of the second secondary winding L2B and a third switch SW3. A second adjustable capacitor C2B is connected to a lower output pin of the second secondary winding L2B. A load Z1 is connected to the third switch SW3. A fourth switch SW4 is also connected to a lower output pin of the second secondary winding L2B. A second load Z2 is connected to the fourth switch SW4.

For the arrangement 310, the second path 302 includes a third adjustable capacitor C3A connected to an upper output pin of the first secondary winding L2A. A first switch SW1 is connected to the adjustable capacitor C3A. An RFout terminal is connected to the first switch SW1 and a third impedance Z3. The switch SW1 can be connected to ground if a fourth impedance Z4 is active. A second switch SW2 is connected to a lower output pin of the first secondary winding L2A and the fourth impedance Z4, which is connected ground. A third capacitor C2A is connected to the adjustable capacitor C3A and the lower output pin of the first secondary winding L2B.

The harmonic tuning is performed by adjusting the adjustable capacitors C3A and C3B. In one example, the second secondary winding L2B is substantially inactive and can be used to manipulate the magnetic field of the active transformer, which is the active windings L1 and L2A. The magnetic flux from the primary winding L1 penetrates into the inactive, second secondary winding L2B. If the second secondary winding L2B has a relatively low impedance, ideally short, for certain frequencies, the second secondary winding L2B will affect the flux of the primary winding L1 at these frequencies and, as a result, the performance of the transformer. The first path 301 is configured to tune the inactive, second secondary winding L2B so that a harmonic to be suppressed falls above it. If a harmonic is above the tuned frequency, also referred to a resonant frequency, the harmonic is significantly or substantially attenuated.

In one example configuration, the switches SW3 and SW4 can be left open or shorted to ground. If the switches SW3 and SW4 are shorted to ground, the effect of the adjustable capacitor C2B can be neglected and current induced in the second secondary winding L2B is higher. A series resonant inductor-capacitor (LC) tank is essentially created and based on the L2B and the C3B. Additionally, it is noted that if the switches SW3 and SW4 are shorted to ground, the OFF impedance for the associated paths can be of arbitrary values. The current in the LC tank flows at its resonant frequency. The resonant frequency can be adjusted so that the harmonic frequency falls or is located above/higher than it.

In another example, the switches SW3 and SW4 are open and a resonant LC tank is formed from L2B-C3B-C2B. The LC tank in this example is a floating parallel resonant tank in that a ground node is not substantially connected. Current in the LC tank flows only at a resonant frequency. Thus, the resonant frequency can be adjusted so that a harmonic frequency falls or is located above/higher. Thus, the resonant tank for the switches open is L2B-C3B-C2B whereas the resonant tank when the switches are closed is L2B-C3B. Additionally, the OFF impedance for the first path 301, Z1 and Z2 are relatively high, such as at least four time greater than an impedance of the C2B.

Additionally, the capacitors C2A and C2B can be adjustable and utilized for output matching to a desired load impedance, such as 50 ohm.

The capacitors C2A and C2B can be adjusted for desired harmonic filtering or switched to relatively small values to create a high impedance.

Some example capacitor values for low bands (0.6-0.96 GHz) of output signals are C2A and C2B at about 1.5 pF and C3A and C3B at about 0.2 pF to 1.4 pF. It is appreciated that other suitable capacitor values can be utilized.

Some examples of harmonics that can be suppressed or attenuated by the arrangement 300 are provided for illustrative purposes only. It is appreciated that other harmonics can also be suppressed or attenuated by the arrangement 300. For low band frequencies (0.6-0.96), second harmonics can be generated for 3G bands B11 and B21 at 1.4 GHz-1.5 GHz. Additionally, for the low band frequencies, third harmonics fall in the 3G/LTE bands B1 and B2, where RX is 2.11-2.17 GHz and B7 RX is 2.62-2.69 GHz.

Figure 4A:
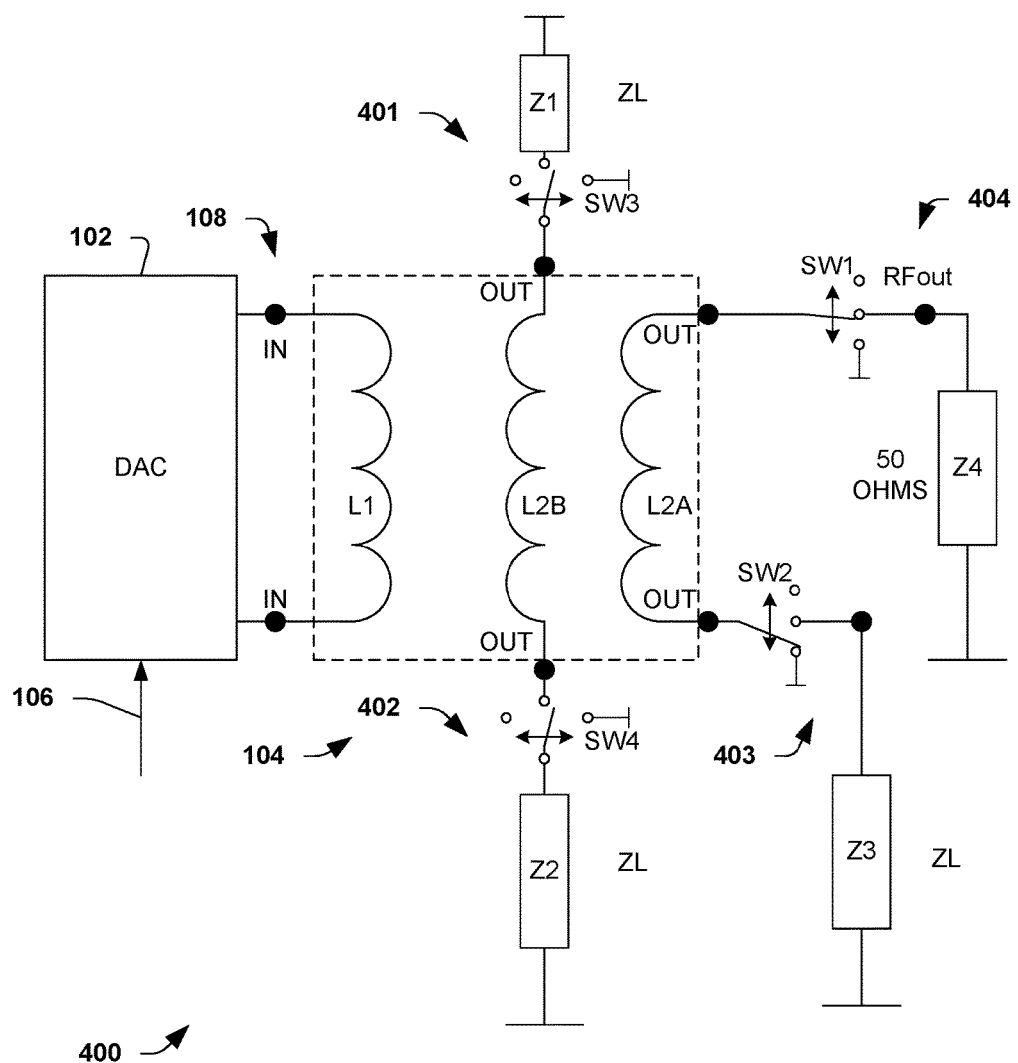
FIG. 4A is a diagram illustrating a transmitter matching network arrangement that operates as a 1:4 RF switch and utilizes three-way switches.

FIG. 4A is a diagram illustrating a transmitter matching network arrangement 400 that functions as a 1:4 RF switch. The arrangement 400 utilizes a transformer to match and select impedances for network or impedance matching for transmission signal. The arrangement 400 is shown in a simplified form to facilitate understanding. It is appreciated that additional circuits and/or components can be utilized with the arrangement 400. The arrangement 400 can be implemented as an apparatus, circuitry, logic and/or the like.

The transmitter (TX) arrangement 400 includes a matching component or circuit 104. The arrangement 400 is configured to generate a plurality of output signals based on an analog input signal 108. The plurality of output signals have selected matching characteristics. The selected matching characteristics include standard specifications, power value, frequency, range of frequencies, impedance matching value, network matching, and the like. Generally, one of the plurality of output signals is generated for an active load/impedance and the other output signals and their associated paths/circuits are inactive.

The matching circuit 104 includes a transformer and a plurality of matching circuit paths coupled to the transformer. The transformer includes a primary winding L1, a first secondary winding L2A and a second secondary winding L2B. The primary winding L1 has two associated input pins, the first secondary winding L2A has two associated output pins and the second secondary winding L2B also has two associated output pins. The matching circuit 104 paths include paths/circuits 401, 402, 403 and 404. Further, the matching circuit includes switches SW1, SW2, SW3, and SW4. The secondary windings L2A and L2B are magnetically coupled to the primary winding L1.

The matching circuit 104 also includes load impedances Z1, Z2, Z3 and Z4. The load impedances in this embodiment are fixed. Thus, the switches SW1, SW2, SW3 and SW4 are three way switches that can be configured as open (high impedance), short to ground (low impedance) and through to the corresponding load impedance.

The first path 401 has the impedance Z1. The third switch SW3 is connected to an upper output pin of the second secondary winding L2B. The third switch SW3 is also switchably connected to ground, the path load, Z3 or open.

The second path 402 has an impedance shown as Z2. The fourth switch SW4 is connected to a lower output pin of the second secondary winding L2B. The fourth switch SW4 is also switchable or configurable to be open, connect the lower output pin to the impedance Z2 or connect to ground. If the SW4 is open, the impedance Z2 can be arbitrary.

The third path 403 has an impedance shown as Z3. A second switch SW2 is connected to a lower output pin of the first secondary winding L2A. The second switch SW2 is also switchably connected to ground, OPEN or and the path impedance Z3.

The fourth path 404 has a load impedance Z4, such as 50 ohm. A first switch SW1 is connected to an upper output pin of the first secondary winding L2A. The first switch SW1 is also switchably connected to ground or the impedance Z4.

The arrangement 400 does not place substantial requirements on load impedances and the like. The switches can be 2-way series or shunt switches, open and ground, or 3-way switches, open, through-ground (GND). Generally, each secondary winding is configured to have one three-way switch connected to it.

Figure 4B:
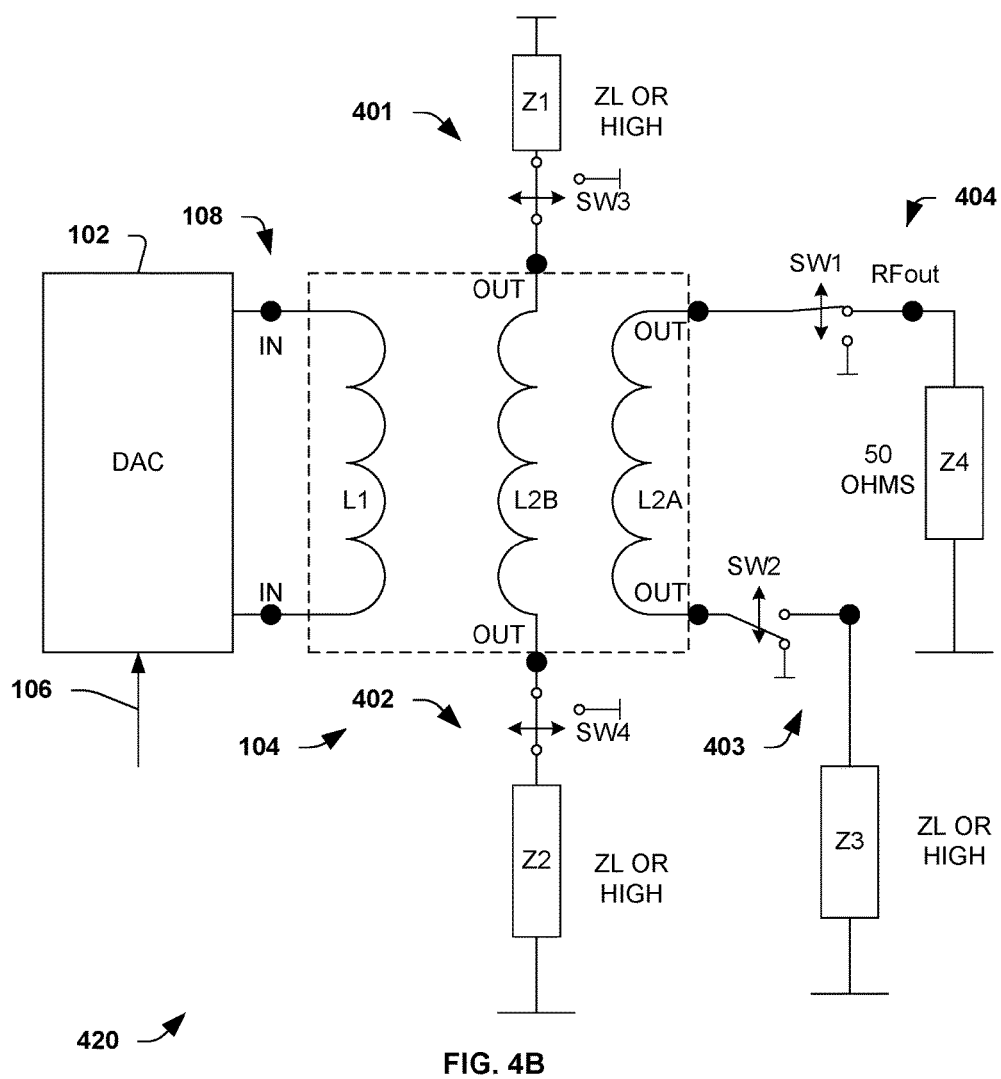
FIG. 4B is a diagram illustrating a transmitter matching network arrangement that operates as a 1:4 RF switch and utilizes two-way switches.

FIG. 4B is a diagram illustrating a transmitter matching network arrangement 420 that functions as a 1:4 RF switch. The arrangement 420 utilizes a transformer to match and select impedances for network or impedance matching for transmission signal. The arrangement 420 is shown in a simplified form to facilitate understanding. It is appreciated that additional circuits and/or components can be utilized with the arrangement 420. The arrangement 420 can be implemented as an apparatus, circuitry, logic and/or the like.

The transmitter (TX) arrangement 420 is substantially similar to the arrangement 400, described above. It includes a matching component or circuit 104. The arrangement 420 is configured to generate a plurality of output signals based on an analog input signal 108. The plurality of output signals have selected matching characteristics. The selected matching characteristics include standard specifications, power value, frequency, range of frequencies, impedance matching value, network matching, and the like.

The matching circuit 104 includes a transformer and a plurality of matching circuit paths coupled to the transformer. The transformer includes a primary winding L1, a first secondary winding L2A and a second secondary winding L2B. The primary winding L1 has two associated input pins, the first secondary winding L2A has two associated output pins and the second secondary winding L2B also has two associated output pins. The matching circuit 104 paths include paths/circuits 401, 402, 403 and 404. Further, the matching circuit includes switches SW1, SW2, SW3, and SW4. The secondary windings L2A and L2B are magnetically coupled to the primary winding L1.

The matching circuit 104 also includes load impedances Z1, Z2, Z3 and Z4. The load impedances can be configured as active (ON) or inactive (OFF). In this example, load impedances are at a high impedance state when inactive (OFF).

The first path 401 has an impedance Z1. The third switch SW3 is connected to an upper output pin of the second secondary winding L2B. The third switch SW3 is switchably connected to ground and the path load, Z1.

The second path 402 has an impedance shown as Z2. The fourth switch SW4 is connected to a lower output pin of the second secondary winding L2B. The fourth switch SW4 is switchable or configurable to connect the lower output pin to the impedance Z2 or connect to ground.

The third path 403 has an impedance shown as Z3. A second switch SW2 is connected to a lower output pin of the first secondary winding L2A. The second switch SW2 is also switchably connected to ground or the path impedance Z3.

The fourth path 404 has a load impedance Z4, such as 50 ohm. A first switch SW1 is connected to an upper output pin of the first secondary winding L2A. The first switch SW1 is also switchably connected to ground or the impedance Z4.

If the impedances Z1 to Z4 can be configured in OFF state to high impedances, one or both of the switches SW3 and SW4 are connected to their load impedances. Thus, the switches can be implemented as two-way switches that connect through to the load impedances or to ground.

As shown in FIG. 4B, the SW1 is connected to ground while the other switches SW2, SW3, and SW4 connect through to their associated loads Z1, Z2 and Z3. One of the loads is active, such as Z1, while the other loads Z2 and Z3 are configured as high impedance. The first secondary winding L2A is inactive and the second secondary winding L2B is active and supplies to the first path 401. One or both of the switches associated to the inactive secondary winding has to be connected to the OFF load impedance (high impedance state).

Figure 4C:
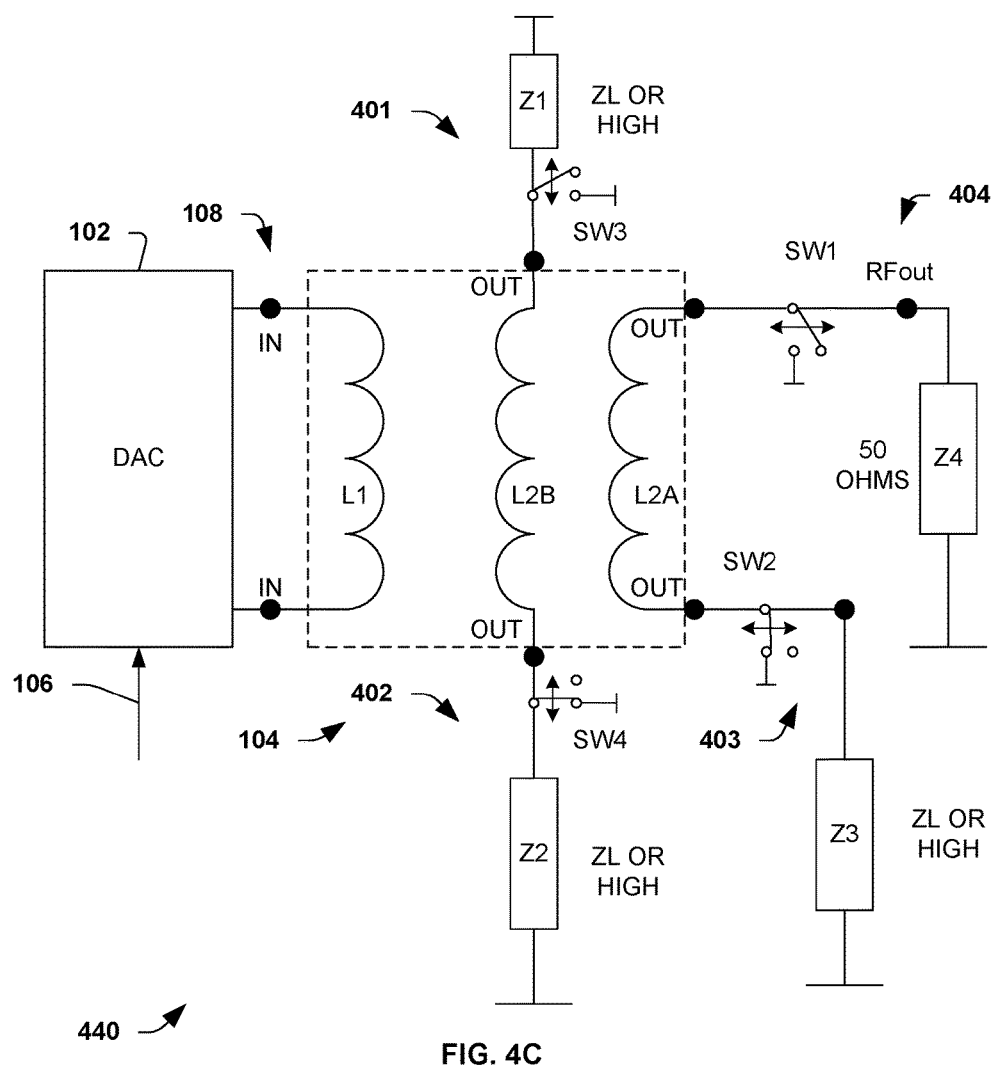
FIG. 4C is a diagram illustrating a transmitter matching network arrangement that operates as a 1:4 RF switch and utilizes shunt switches.

FIG. 4C is a diagram illustrating a transmitter matching network arrangement 440 that functions as a 1:4 RF switch. The arrangement 440 also utilizes a transformer to match and select impedances for network or impedance matching for transmission signal. The arrangement 440 is shown in a simplified form to facilitate understanding. It is appreciated that additional circuits and/or components can be utilized with the arrangement 440. The arrangement 440 can be implemented as an apparatus, circuitry, logic and/or the like.

The transmitter (TX) arrangement 440 is substantially similar to the arrangements 400 and 420, described above. It includes a matching component or circuit 104. The arrangement 440 is configured to generate a plurality of output signals based on an analog input signal 108.

However, the switches SW3 and SW4 are implemented as shunt type switches and are switchable to open or ground, as shown in FIG. 4C.

It is appreciated that other suitable switch types and combinations thereof are contemplated for use with the various embodiments. The switch types include shunt, two-way, three-way switches and the like. The variety of combinations are possible due to using more than one secondary winding with the transformer.

Figure 5:
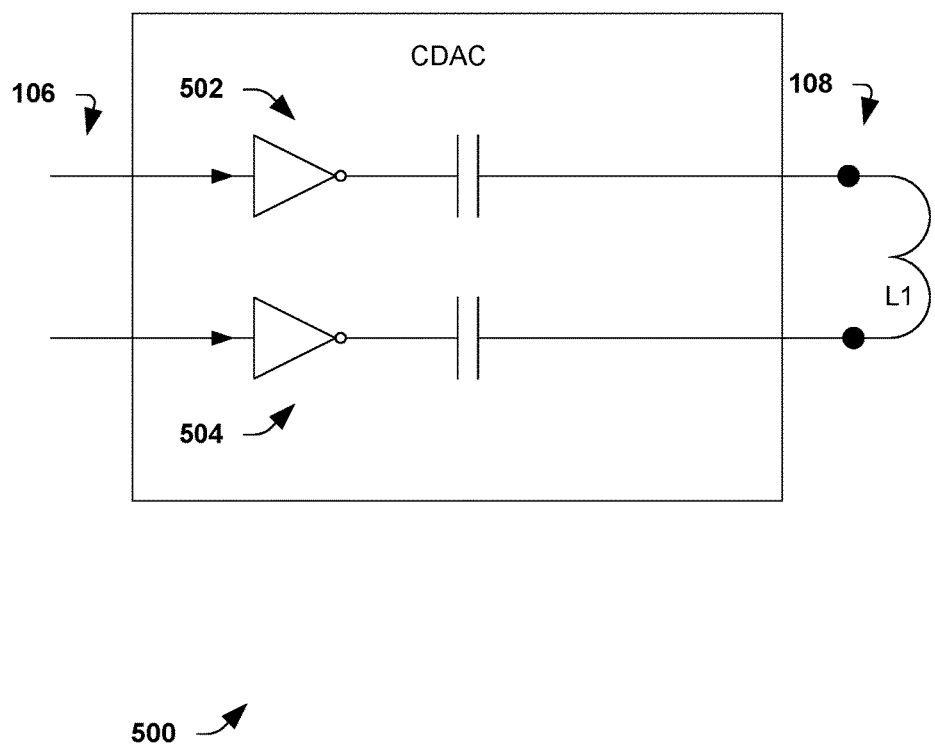
FIG. 5 is a diagram illustrating a capacitive digital to analog converter (CDAC).

FIG. 5 is a diagram illustrating a capacitive digital to analog converter (CDAC) 500. The CDAC 500 utilizes a transformer to match and select impedances for network or impedance matching for transmission signal. The CDAC 500 is shown in a simplified form to facilitate understanding. It is appreciated that additional circuits and/or components can be utilized with the CDAC 500. The CDAC 500 can be used as the DAC 102 in the various embodiments and variations thereof.

The CDAC 500 is a broadband digital to analog converter that also functions as a medium-power mixer (up-converter). It is appreciated that the CDAC can also be implemented as a high-power mixer. The CDAC 500 typically has a capacitive output impedance with a relatively low resistive part, such as 5 ohm or lower. The CDAC 500 has a differential output and is single ended, in that matching network has a transformer for differential to single ended conversion. The single ended is the load (antenna). It is appreciated that various circuits can be present between the output of the matching network and the antenna, such as a power amplifier, filter, switch and the like. Typically, the chain of circuits after the matching network is single ended.

The CDAC 500 can also be implemented as single ended, however being implemented as differential typically provides higher power and better noise rejection.

The CDAC 500 receives a digital input signal 106 and generates an analog input signal 108 based on the digital input signal 106. The analog input signal 108 is supplied to a primary winding L1 of a transformer.

The CDAC 500 includes an upper path 502 and a lower path 504. The upper path 502 includes an inverter and a capacitor connected in series. The lower path 504 also includes an inverter and a capacitor connected in series.

Figure 6:
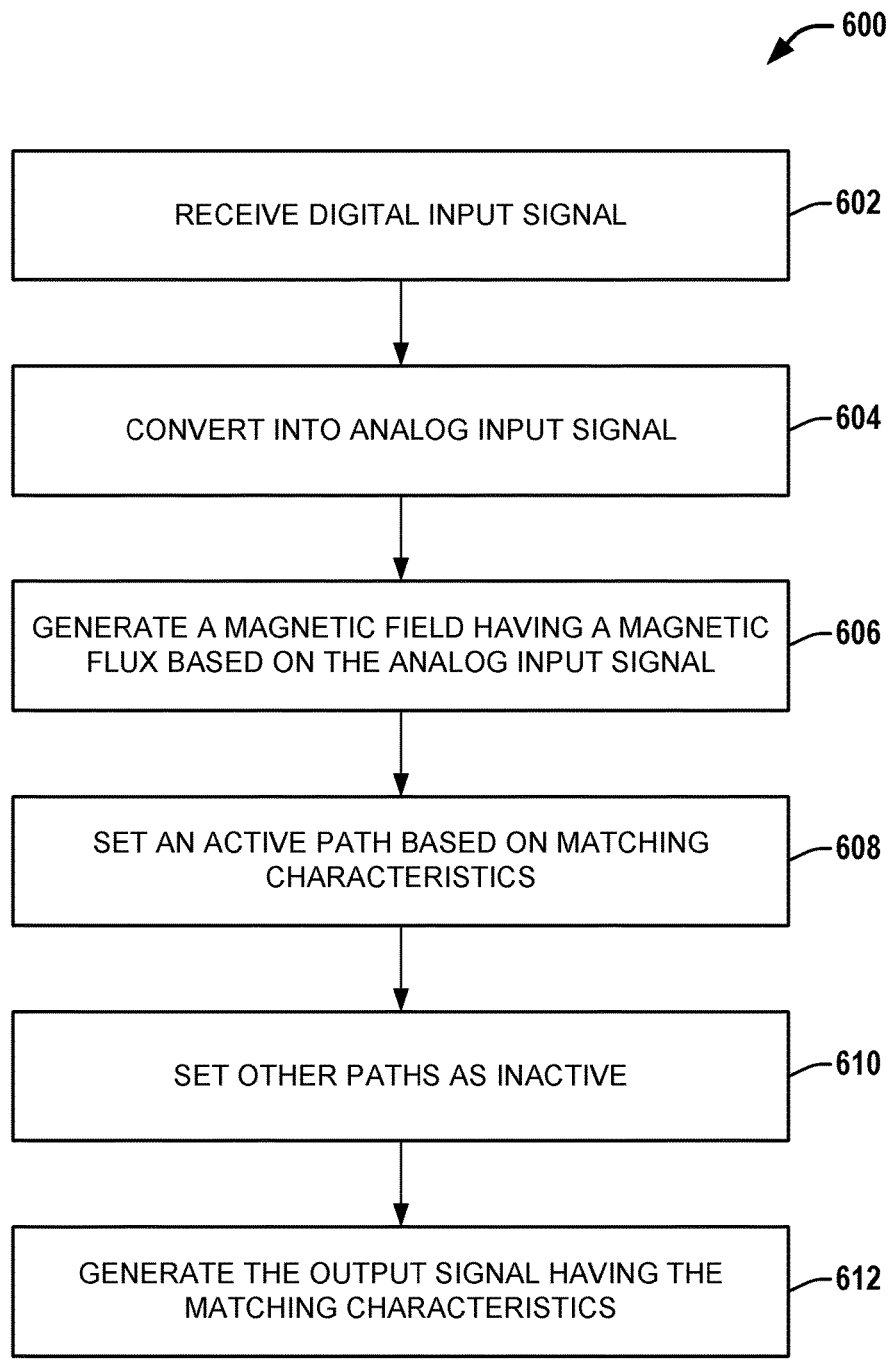
FIG. 6 is a flow diagram illustrating a method that performs network matching for a plurality of loads using a transformer having multiple secondary windings.

FIG. 6 is a flow diagram illustrating a method 600 that performs network matching for a plurality of loads using a transformer having multiple secondary windings. The method 600 generates one or more output signals using the multiple secondary windings to reduce the number of required switches. Additionally, matching network paths coupled to the secondary windings can be used to facilitate the network matching, suppress or remove harmonics, and the like.

The method 600 begins at block 602, wherein a digital input signal is received at a digital to analog converter (DAC). The digital input signal can be a signal for transmission. In one example, the digital input signal includes information to be transmitted to another device.

The DAC converts the digital input signal into an analog input signal at block 604. In one example, a CDAC is used to interpolate the digital input signal and generate the analog input signal.

A primary winding generates a magnetic field having a magnetic flux based on the analog input signal at block 606.

A first secondary winding and a second secondary winding are also magnetically coupled to the primary winding at block 606. The first and secondary windings have upper and lower pins/terminal for providing power based on the magnetic field from the primary winding.

Generally, one of the pins provides power and is considered active and has an active load. Thus, the 1:4 switching operation is provided. The other pins can be connected as open, to ground, to a high impedance, and/or a low impedance as described above.

Each transformer pin can have a matching network path connected thereto. Generally, the associated matching network paths have matching characteristics for a particular load, typically an RF load/antenna. Collectively, there are a plurality of matching network paths connected to the first and second secondary windings.

One of the plurality of matching network paths is set as active at block 608. In one example, the active path is selected to have matching characteristics particular to an RF load.

The other paths of the plurality of matching network paths are set as inactive at block 610. Setting to inactive can include configuring a path load to high impedance, low impedance, switchably connecting an associated winding terminal to ground, switchably connecting an associated winding to an open circuit, and the like.

The output signal is generated at block 612 and has the selected matching characteristics. The inactive paths can contribute to provide the selected matching characteristics, perform filtering, remove harmonics and the like.

The secondary winding associated with or connected to the active path supplies power to its output terminal/pin connected to the active path. The other winding can be considered inactive in that it is not supplying power or substantial power to its output terminals/pins.

It is appreciated that the plurality of matching network paths can be configured to have selected impedance and capacitance values and the like associated with various modes or matching characteristics. Additionally, the one or more matching network paths can be configured to form an LC tank, wherein the LC tank removes and/or reduces harmonics at selected frequencies.

It is appreciated that the method 600 can also switch from the active path to a current active path, wherein the current active path provides an output signal and has associated matching characteristics with a different active load. The prior active path is then configured to be inactive. Thus, the method 600 can provide power via output signals at the various matching network paths. As a result, switching, such as 1:4 or 1:3 can be provided using the secondary windings.

While the methods are illustrated and described above as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

Figure 7:
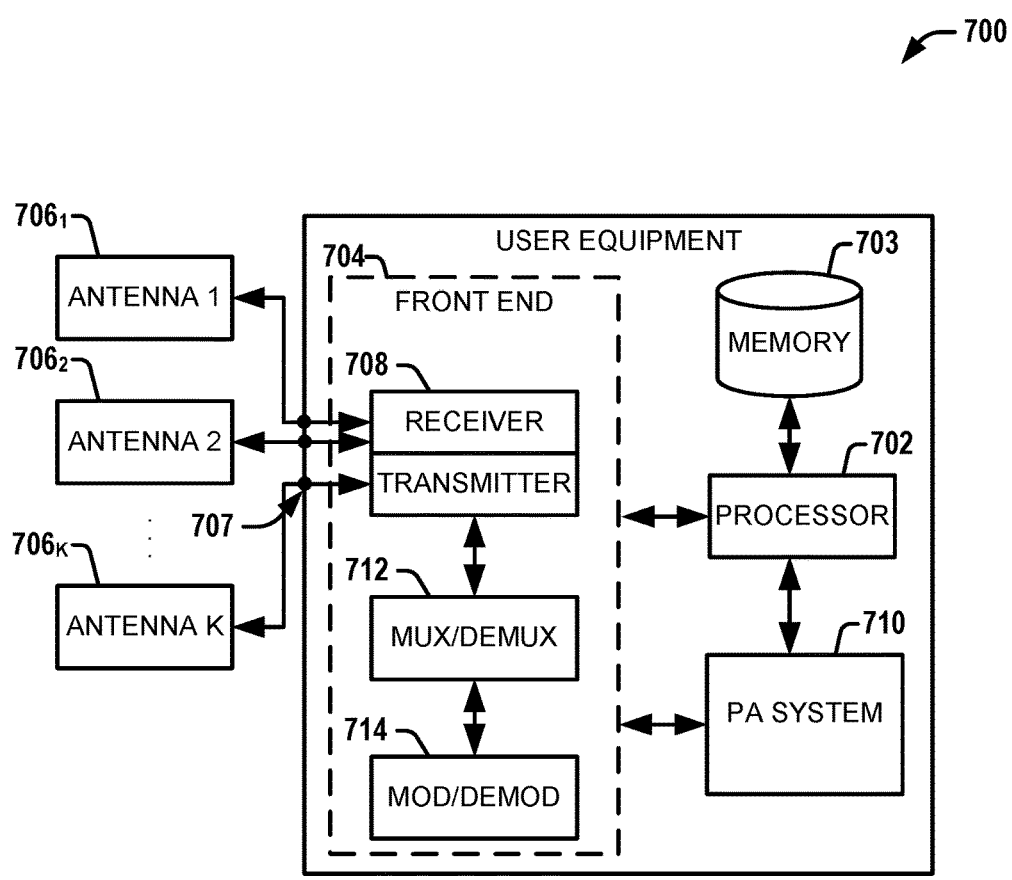
FIG. 7 is a diagram illustrating an exemplary user equipment or mobile communication device.

FIG. 7 is a diagram illustrating an exemplary user equipment or mobile communication device 700 that can be utilized with the one or more embodiments described above.

The mobile communication device 700, for example, comprises a digital baseband processor 702 that can be coupled to a data store or memory 703, a front end 704 (e.g., an RF front end, an acoustic front end, or the other like front end) and a plurality of antenna ports 707 for connecting to a plurality of antennas 706$_1$ to 706$_k$ (k being a positive integer). The antennas 706$_1$ to 706$_k$ can receive and transmit signals to and from one or more wireless devices such as access points, access terminals, wireless ports, routers and so forth, which can operate within a radio access network or other communication network generated via a network device. The user equipment 700 can be a radio frequency (RF) device for communicating RF signals, an acoustic device for communicating acoustic signals, or any other signal communication device, such as a computer, a personal digital assistant, a mobile phone or smart phone, a tablet PC, a modem, a notebook, a router, a switch, a repeater, a PC, network device, base station or a like device that can operate to communicate with a network or other device according to one or more different communication protocols or standards.

The front end 704 can include a communication platform, which comprises electronic components and associated circuitry that provide for processing, manipulation or shaping of the received or transmitted signals via one or more receivers or transmitters 708, a mux/demux component 712, and a mod/demod component 714. The one or more transmitters 708 can include a DTx, such as the DTx arrangements described above, which facilitates generation of the transmitted signals.

The front end 704, for example, is coupled to the digital baseband processor 702 and the set of antenna ports 707, in which the set of antennas 706$_1$ to 706$_k$ can be part of the front end.

The user equipment device 700 can also include a processor 702 or a controller that can operate to provide or control one or more components of the mobile device 700. For example, the processor 702 can confer functionality, at least in part, to substantially any electronic component within the mobile communication device 700, in accordance with aspects of the disclosure.

The processor 702 can operate to enable the mobile communication device 700 to process data (e.g., symbols, bits, or chips) for multiplexing/demultiplexing with the mux/demux component 712, or modulation/demodulation via the mod/demod component 714, such as implementing direct and inverse fast Fourier transforms, selection of modulation rates, selection of data packet formats, inter-packet times, etc. Memory 703 can store data structures (e.g., metadata), code structure(s) (e.g., modules, objects, classes, procedures, or the like) or instructions, network or device information such as policies and specifications, attachment protocols, code sequences for scrambling, spreading and pilot (e.g., reference signal(s)) transmission, frequency offsets, cell IDs, and other data for detecting and identifying various characteristics related to RF input signals, a power output or other signal components during power generation.

The processor 702 is functionally and/or communicatively coupled (e.g., through a memory bus) to memory 703 in order to store or retrieve information necessary to operate and confer functionality, at least in part, to communication platform or front end 704, the power amplifier (PA) system 710 and substantially any other operational aspects of the PA system 710.

While the apparatus has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

In particular regard to the various functions performed by the above described components (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. In addition, while a particular feature may have been disclosed with respect to only one of several implementations, such feature may be combined with one or more other features of the other implementations as may be desired and advantageous for any given or particular application.

Examples can include subject matter such as a method, means for performing acts or blocks of the method, at least one machine-readable medium including instructions that, when performed by a machine cause the machine to perform acts of the method or of an apparatus or system for concurrent communication using multiple communication technologies according to embodiments and examples described herein.

Example 1 is an apparatus for a network matching switch. The apparatus comprises a primary winding, a first secondary winding, a second secondary winding and a plurality of matching network paths. The primary winding is configured to generate a magnetic field based on an analog input signal. The first secondary winding is configured is inductively coupled to the primary winding. The second secondary winding is inductively coupled to the primary winding. The plurality of matching network paths are coupled to the first secondary winding and the second secondary winding. An active path is selected or configured from the plurality of matching network paths and provides power to an active load.

Example 2 is an apparatus including the subject matter of Example 1, including or omitting optional elements, where the plurality of matching network paths generate matching characteristics for a first output signal.

Example 3 is apparatus including the subject matter of any of Examples 1-2, including or omitting optional elements, where the plurality of matching network paths generate matching characteristics including an impedance and frequency range.

Example 4 is apparatus including the subject matter of any of Examples 1-3, including or omitting optional elements, where one or more of the plurality of matching network paths reduce selected harmonics from the output signal.

Example 5 is apparatus including the subject matter of any of Examples 1-4, including or omitting optional elements, further comprising a digital to analog converter (DAC) configured to generate the analog input signal from a digital input signal.

Example 6 is apparatus including the subject matter of any of Examples 1-5, including or omitting optional elements, where the DAC is a capacitive digital to analog converter (CDAC).

Example 7 is apparatus including the subject matter of any of Examples 1-6, including or omitting optional elements, where one of the first secondary winding and the second secondary winding is active and the other of the first secondary winding and the second secondary winding is inactive.

Example 8 is apparatus including the subject matter of any of Examples 1-7, including or omitting optional elements, where the active winding is configured to provide an output signal with the active path.

Example 9 is apparatus including the subject matter of any of Examples 1-8, including or omitting optional elements, where the inactive winding is configured to facilitate harmonic tuning and remove fundamental harmonics from the output signal.

Example 10 is apparatus including the subject matter of any of Examples 1-9, including or omitting optional elements, where an inactive path of the plurality of matching network paths generates a relatively high impedance.

Example 11 is apparatus including the subject matter of any of Examples 1-10, including or omitting optional elements, where an inactive path of the plurality of matching network paths forms an open circuit.

Example 12 is apparatus including the subject matter of any of Examples 1-11, including or omitting optional elements, where an inactive path of the plurality of matching network paths includes a switch connectable to ground or open circuit.

Example 13 is apparatus including the subject matter of any of Examples 1-12, including or omitting optional elements, where wherein there are at least two inactive paths of the plurality of matching network paths present.

Example 14 is a switching apparatus for matching networks. The apparatus comprises a digital to analog converter, a primary winding, an active secondary winding, and an inactive secondary winding. The digital to analog converter is configured to generate an analog input signal. The primary winding configured to generate a magnetic field based on the analog input signal. The active secondary winding configured to generate an output signal to an active load. The inactive secondary winding configured to filter the output signal.

Example 15 is apparatus including the subject matter of Example 14, including or omitting optional elements, further comprising an active path configured to connect the active secondary winding to the active load.

Example 16 is apparatus including the subject matter of any of Examples 14-15, including or omitting optional elements, further comprising a harmonic tuning path coupled to the inactive secondary winding, wherein the harmonic tuning path includes a capacitor.

Example 17 is apparatus including the subject matter of any of Examples 14-16, including or omitting optional elements, wherein the harmonic tuning path removes fundamental harmonics from the output signal.

Example 18 is a method for operating a transformer radio frequency switch. The method comprises generating a magnetic field based on an analog input signal by a primary winding, magnetically coupling a first secondary winding and a second secondary winding to the primary winding, selecting a path of a plurality of matching network paths as active based on matching characteristics for an active load, and generating an output signal at the first secondary winding using the active path, wherein the selected path provides the matching characteristics.

Example 19 is apparatus including the subject matter of Example 18, including or omitting optional elements, further comprising setting a second path and a third path of the plurality of matching network paths as inactive.

Example 20 is apparatus including the subject matter of any of Examples 18-19, including or omitting optional elements, further comprising removing a fundamental harmonic from the output signal by the plurality of matching network paths.

Example 21 is an apparatus to operate as a network matching switch. The apparatus comprises a means to convert an digital signal into analog input signal, a means to generate a magnetic field based on the analog input signal, and a means to provide power as an output signal based on the magnetic field from a plurality of secondary windings.

Example 22 is apparatus including the subject matter of Example 21, including or omitting optional elements, further comprising a means to remove fundamental harmonics from the output signal.

Various illustrative logics, logical blocks, modules, and circuits described in connection with aspects disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor can be a microprocessor, but, in the alternative, processor can be any conventional processor, controller, microcontroller, or state machine.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. In addition, while a particular feature may have been disclosed with respect to only one of several implementations, such feature may be combined with one or more other features of the other implementations as may be desired and advantageous for any given or particular application.

The invention claimed is:

1. An apparatus for a network matching switch, the apparatus comprising:
   a primary winding configured to generate a magnetic field based on an analog input signal;
   a first secondary winding inductively coupled to the primary winding;
   a second secondary winding inductively coupled to the primary winding, wherein the second secondary winding is distinct from the first secondary winding;
   a plurality of matching network paths coupled to the first secondary winding and the second secondary winding and associated with a plurality of output signals; and
   wherein an active path is selected from the plurality of matching network paths and provides power to an active load, wherein the active path is connected to one output winding of the first secondary winding and the second secondary winding and generates one of the plurality of output signals.

2. The apparatus of claim 1, wherein the plurality of matching network paths generate matching characteristics for a first output signal.

3. The apparatus of claim 1, wherein the plurality of matching network paths generate matching characteristics including an impedance and frequency range.

4. The apparatus of claim 1, wherein one or more of the plurality of matching network paths reduce selected harmonics from the output signal.

5. The apparatus of claim 1, further comprising a digital to analog converter (DAC) configured to generate the analog input signal from a digital input signal.

6. The apparatus of claim 5, wherein the DAC is a capacitive digital to analog converter (CDAC).

7. The apparatus of claim 1, wherein one of the first secondary winding and the second secondary winding is active and an other of the first secondary winding and the second secondary winding is inactive.

8. The apparatus of claim 7, wherein the active winding is configured to provide an output signal with the active path.

9. The apparatus of claim 8, wherein the inactive winding is configured to facilitate harmonic tuning and remove fundamental harmonics from the output signal.

10. The apparatus of claim 1, wherein the plurality of matching network paths are configured to have one or more inactive paths and the active path, wherein the active path is set to a load impedance.

11. The apparatus of claim 10, wherein the one or more inactive paths are configured to form an open circuit.

12. The apparatus of claim 1, wherein an inactive path of the plurality of matching network paths includes a switch connectable to ground or open circuit.

13. The apparatus of claim 1, wherein at least two inactive paths of the plurality of matching network paths are present.

14. A method for operating a transformer radio frequency switch, the method comprising:
   generating a magnetic field based on an analog input signal by a primary winding;
   magnetically coupling a first secondary winding and a second secondary winding to the primary winding;
   selecting a path of a plurality of matching network paths as active based on matching characteristics for an active load, wherein the plurality of matching network paths are each connected to one of the first secondary winding and the second secondary winding and the selected active path is connected to the first secondary winding; and
   generating an output signal at the first secondary winding using the active path, wherein the selected path provides the matching characteristics.

15. The method of claim 14, further comprising setting a second path and a third path of the plurality of matching network paths as inactive.

16. The method of claim 14, further comprising removing a fundamental harmonic from the output signal by the plurality of matching network paths.

* * * * *